(12) United States Patent
Ping et al.

(10) Patent No.: US 11,856,758 B2
(45) Date of Patent: Dec. 26, 2023

(54) METHOD FOR MANUFACTURING MEMORY AND SAME

(71) Applicant: CHANGXIN MEMORY TECHNOLOGIES, INC., Hefei (CN)

(72) Inventors: Er-Xuan Ping, Hefei (CN); Zhen Zhou, Hefei (CN); Lingguo Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 178 days.

(21) Appl. No.: 17/487,622

(22) Filed: Sep. 28, 2021

(65) Prior Publication Data
US 2022/0093608 A1 Mar. 24, 2022

Related U.S. Application Data

(63) Continuation of application No. PCT/CN2021/103864, filed on Jun. 30, 2021.

(30) Foreign Application Priority Data

Sep. 24, 2020 (CN) .......................... 202011018109.X

(51) Int. Cl.
  *H01L 27/108* (2006.01)
  *H10B 12/00* (2023.01)
(52) U.S. Cl.
  CPC ......... *H10B 12/485* (2023.02); *H10B 12/482* (2023.02)
(58) Field of Classification Search
  CPC ..... H10B 12/482; H10B 12/485; H10B 12/00
  See application file for complete search history.

(56) References Cited

U.S. PATENT DOCUMENTS

| 7,648,875 | B2 | 1/2010 | Hong |
| 7,767,569 | B2 | 8/2010 | Maekawa |
| 7,846,827 | B2 | 12/2010 | Kim |
| 8,748,254 | B2 | 6/2014 | Lee |
| 9,691,700 | B2 | 6/2017 | Kuroki |
| 9,837,490 | B2 | 12/2017 | Park et al. |

(Continued)

FOREIGN PATENT DOCUMENTS

| CN | 1959953 A | 5/2007 |
| CN | 101075093 A | 11/2007 |

(Continued)

*Primary Examiner* — Mohammed R Alam
(74) *Attorney, Agent, or Firm* — Cooper Legal Group, LLC

(57) ABSTRACT

A method for manufacturing a memory includes: providing a substrate and multiple discrete pseudo bit line contact layers, a plurality of active areas being provided in the substrate, and each bit line contact layer being electrically connected to the active areas; forming pseudo bit line structures at tops of the pseudo bit line contact layers; forming sacrificial layers that fill regions between the adjacent pseudo bit line structures and are located on side walls of the pseudo bit line structures and the pseudo bit line contact layers; after forming the sacrificial layers, removing the pseudo bit line structures to form through holes exposing the pseudo bit line contact layers; removing the pseudo bit line contact layers to form through holes in the substrate; and forming bit line contact layers that fill the through holes in the substrate and are electrically connected to the active areas.

14 Claims, 18 Drawing Sheets

(56) References Cited

U.S. PATENT DOCUMENTS

| | | |
|---|---|---|
| 10,181,473 B2 | 1/2019 | Feng et al. |
| 10,453,849 B2 | 10/2019 | Liou et al. |
| 10,461,153 B2 | 10/2019 | Lee et al. |
| 10,600,790 B2 | 3/2020 | Feng et al. |
| 10,622,249 B2 | 4/2020 | Yoon |
| 10,763,264 B2 | 9/2020 | Liou et al. |
| 10,886,276 B2 | 1/2021 | Hwang |
| 10,923,390 B2 | 2/2021 | Yoon |
| 2006/0146595 A1 | 7/2006 | Hong |
| 2006/0148227 A1 | 7/2006 | Kronke |
| 2007/0096188 A1 | 5/2007 | Maekawa |
| 2010/0233878 A1 | 9/2010 | Kim |
| 2012/0043642 A1 | 2/2012 | Kuroki |
| 2013/0052787 A1 | 2/2013 | Lee |
| 2017/0005166 A1 | 1/2017 | Park et al. |
| 2017/0084613 A1 | 3/2017 | Hwang |
| 2018/0226408 A1 | 8/2018 | Feng et al. |
| 2019/0019805 A1* | 1/2019 | Feng .................... H10B 12/482 |
| 2019/0088739 A1 | 3/2019 | Lee et al. |
| 2019/0103302 A1 | 4/2019 | Yoon |
| 2019/0273083 A1 | 9/2019 | Liou et al. |
| 2020/0013783 A1 | 1/2020 | Liou et al. |
| 2020/0203213 A1 | 6/2020 | Yoon |
| 2021/0035613 A1* | 2/2021 | Park .................... H10B 12/485 |

FOREIGN PATENT DOCUMENTS

| | | |
|---|---|---|
| CN | 103730435 A | 4/2014 |
| CN | 102347331 B | 12/2015 |
| CN | 102543944 B | 6/2016 |
| CN | 107482007 A | 12/2017 |
| CN | 107611133 A | 1/2018 |
| CN | 107611133 B | 8/2018 |
| CN | 108389860 A | 8/2018 |
| CN | 109148376 A | 1/2019 |
| CN | 109244090 A | 1/2019 |
| CN | 109524383 A | 3/2019 |
| CN | 109979940 A | 7/2019 |
| CN | 209216973 U | 8/2019 |
| CN | 110223982 A | 9/2019 |
| CN | 110890365 A | 3/2020 |
| CN | 110957320 A | 4/2020 |

* cited by examiner

US 11,856,758 B2

METHOD FOR MANUFACTURING MEMORY AND SAME

CROSS-REFERENCE TO RELATED APPLICATIONS

The present application a continuation application of International Application No. PCT/CN2021/103864, filed on Jun. 30, 2021, which claims priority to Chinese Patent Application No. 202011018109.X, filed on Sep. 24, 2020. The disclosures of International Application No. PCT/CN2021/103864 and Chinese Patent Application No. 202011018109.X are hereby incorporated by reference in their entireties.

BACKGROUND

A memory is a memory component used to store programs and various data information. A random access memory may be divided into a static random access memory and a dynamic random access memory. The dynamic random access memory usually includes a capacitor and a transistor connected to the capacitor. The capacitor is used to store charges representing stored information, and the transistor is a switch that controls inflow and release of charges of the capacitor. When data is written, a word line provides a high level, the transistor is switched on, and a bit line charges the capacitor. During reading, the word line also provides a high level, the transistor is switched on, and the capacitor is discharged to enable the bit line to obtain a read-out signal.

However, with continuous size reduction of a process node of the memory, the performance of the memory is to be improved

SUMMARY

Embodiments of the present disclosure relate to the technical field of semiconductors, and in particular to a method for manufacturing memory and same.

An embodiment of the present disclosure provides a method for manufacturing a memory. The method for manufacturing a memory includes the following operations. A substrate and a plurality of pseudo discrete bit line contact layers are provided, a plurality of active areas are provided in the substrate, and the pseudo bit line contact layers are one to one connected to the active areas. Pseudo bit line structures are formed at tops of the pseudo bit line contact layers. Sacrificial layers filling regions between adjacent pseudo bit line structures are formed, and the sacrificial layer are located on side walls of the pseudo bit line structures and side walls of the pseudo bit line contact layers. After forming the sacrificial layers, the pseudo bit line structures are removed to form through holes exposing the pseudo bit line contact layers. The pseudo bit line contact layers are removed to form through holes in the substrate. Bit line contact layers that fill the through holes in the substrate are formed and are electrically connected to the active areas.

An embodiment of the present disclosure also provides a memory manufactured using the foregoing method. The memory includes: a substrate in which a plurality of active areas are provided; a plurality of discrete bit line contact layers, which are one-to one electrically connected to the active areas; and bit line conductive parts, located on tops of the bit line contact layers.

BRIEF DESCRIPTION OF THE DRAWINGS

One or more embodiments are exemplified by the corresponding accompanying drawings. These exemplified descriptions do not constitute a limitation to the embodiments. The accompanying drawings do not constitute scaling restrictions unless otherwise stated.

DETAILED DESCRIPTION

It is known from the background that the performance of a memory in the prior art needs to be improved.

It is found by analysis that the main causes of the above-described problem are as follows: a pseudo bit line structure is formed in a through hole defined by a bit line contact layer and a sacrificial layer, when the pseudo bit line structure is removed by an etching method subsequently, the bit line contact layer may be damaged, and meanwhile, non-volatile impurities remain in the bit line contact layer, so that the operating speed of the memory is influenced.

In order to solve the above-described problem, the embodiments of the present disclosure provide a method for manufacturing a memory. A pseudo bit line structure is formed in a through hole defined by a pseudo bit line contact layer and a sacrificial layer. After the pseudo bit line structure is removed subsequently, the pseudo bit line contact layer is also removed to form a through hole in a substrate, and a bit line contact layer is formed in the through hole. Thus, damage to the bit line contact layer, when the pseudo bit line structure is removed by etching, can be avoided, and non-volatile impurities which may otherwise remain in the bit line contact layer can be avoid, so that the performance of the memory is improved.

In order to make the objectives, the technical solutions and the advantages of the embodiments of the present disclosure clearer, detailed descriptions will be made to all the embodiments of the present disclosure in combination with the accompanying drawings below. However, those of ordinary skill in the art can understand that in the various embodiments of the present disclosure, many technical details are presented in order to make the present disclosure better understood by readers. However, the technical solutions claimed in the present disclosure can also be implemented without these technical details and various changes and modifications based on the embodiments.

The first embodiment of the present disclosure provides a method for manufacturing a memory. FIG. 1 to FIG. 17 are schematic structural diagrams corresponding to each of the operations in the method.

Figure 1:
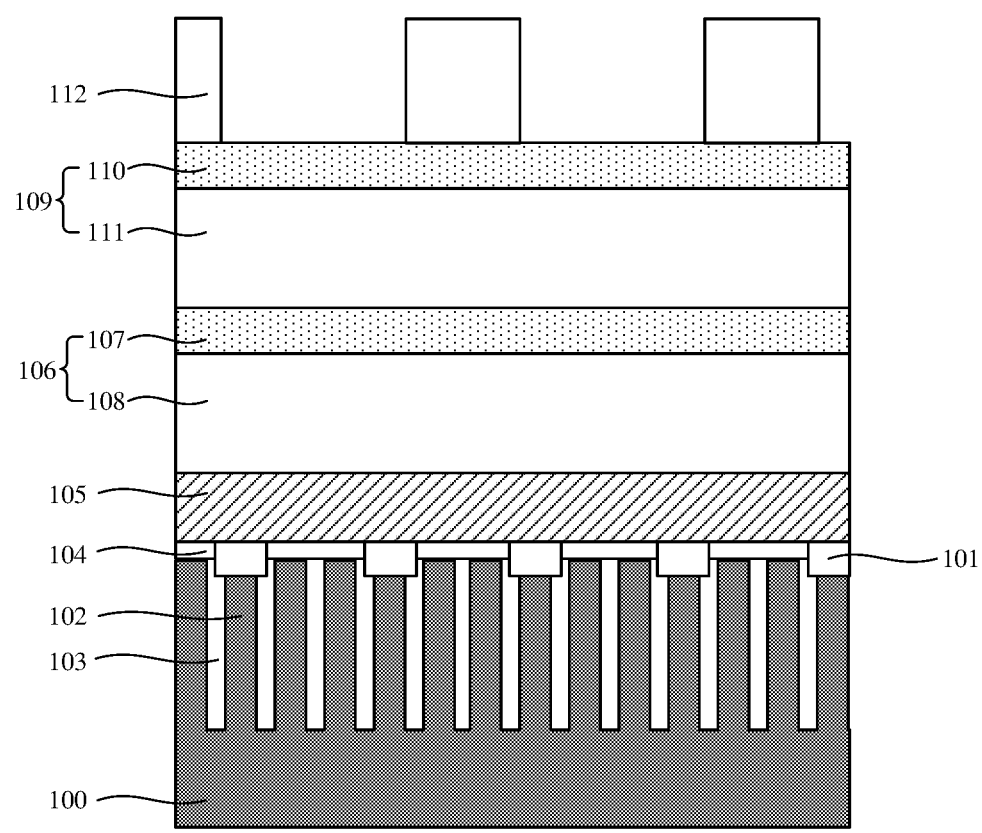
FIGS. 1 to 17 are schematic structural diagrams corresponding to each operation in a method for manufacturing a memory provided in the first embodiment of the present disclosure.

Referring to FIG. 1, a substrate 100 and a plurality of discrete pseudo bit line contact layers 101 are provided. A plurality of active areas 102 are provided in the substrate 100, and the pseudo bit line contact layers 101 are one-to-one electrically connected to the active areas 102.

A material of the substrate 100 includes silicon, germanium, or other semiconductor materials.

A region between adjacent active areas 102 is filled with a first isolation layer 103 used to isolate the plurality of active areas 102. A material of the first isolation layer 103 is an insulation material, for example, silicon dioxide.

In the present embodiment, part of each pseudo bit line contact layer 101 is located in the substrate 100, and part thereof is higher than a surface of the substrate 100. In other embodiments, the bit line contact layer can also be located on the surface of the substrate.

A material of the pseudo bit line contact layer 101 includes silicon nitride, silicon oxynitride or silicon carbonitride.

In the present embodiment, a second isolation layer 104 may further be formed on the surface of the substrate 100. The second isolation layer 104 fills a region between the discrete pseudo bit line contact layers 101 to isolate the plurality of bit line contact layers formed subsequently.

A material of the second isolation layer 104 is an insulation material, such as silicon nitride. The material of the second isolation layer 104 is different from that of the pseudo bit line contact layers 101.

Referring to FIG. 1 to FIG. 6, a pseudo bit line structure 117 is formed on the top of each pseudo bit line contact layer 101.

The pseudo bit line structure 117 is used to define a position and size of a subsequently formed bit line structure. That is, the size of the pseudo bit line structure 117 is the same as the size of the subsequently formed bit line structure. Since the pseudo bit line structure 117 does not need to have a conductive characteristic, an insulation material can be used as the material of the pseudo bit line structure 117.

Said forming the pseudo bit line structure 117 includes the following operations. A pseudo bit line layer 105 covering the pseudo bit line contact layer 101 is formed on the substrate 100. A patterned mask layer 115 is formed on the pseudo bit line layer 105. The pseudo bit line layer 105 is etched by taking the patterned mask layer 115 as a mask to form the pseudo bit line structure 117.

Specifically, in the present embodiment, the pseudo bit line structure 117 is formed by a double patterning (SADP) method.

The method for forming the pseudo bit line structure 117 will be described in detail below in combination with the accompanying drawings.

Referring to FIG. 1, a pseudo bit line layer 105 covering the pseudo bit line contact layer 101 is formed on a substrate 100.

A bottom-layer mask layer 106 and a core layer 109 are sequentially stacked on the pseudo bit line layer 105. In the present embodiment, the bottom-layer mask layer 106 includes a first bottom-layer mask layer 107 and a second bottom-layer mask layer 108.

A material of the first bottom-layer mask layer 107 is different from that of the second bottom-layer mask layer 108. Specifically, the material of the first bottom-layer mask layer 107 may be silicon oxynitride, and the material of the second bottom-layer mask layer 108 may be hydrogen-containing silicon oxide.

It can be understood that, in other embodiments, the bottom-layer mask layer may also be of a single-layer structure.

In the present embodiment, the core layer 109 includes a first core layer 110 and a second core layer 111. A material of the first core layer 110 includes silicon oxynitride. A material of the second core layer 111 includes hydrogen-containing silicon oxide.

In other embodiments, the core layer may also be of a single-layer structure.

A patterned photoresist layer 112 is formed on the core layer 109.

Figure 2:
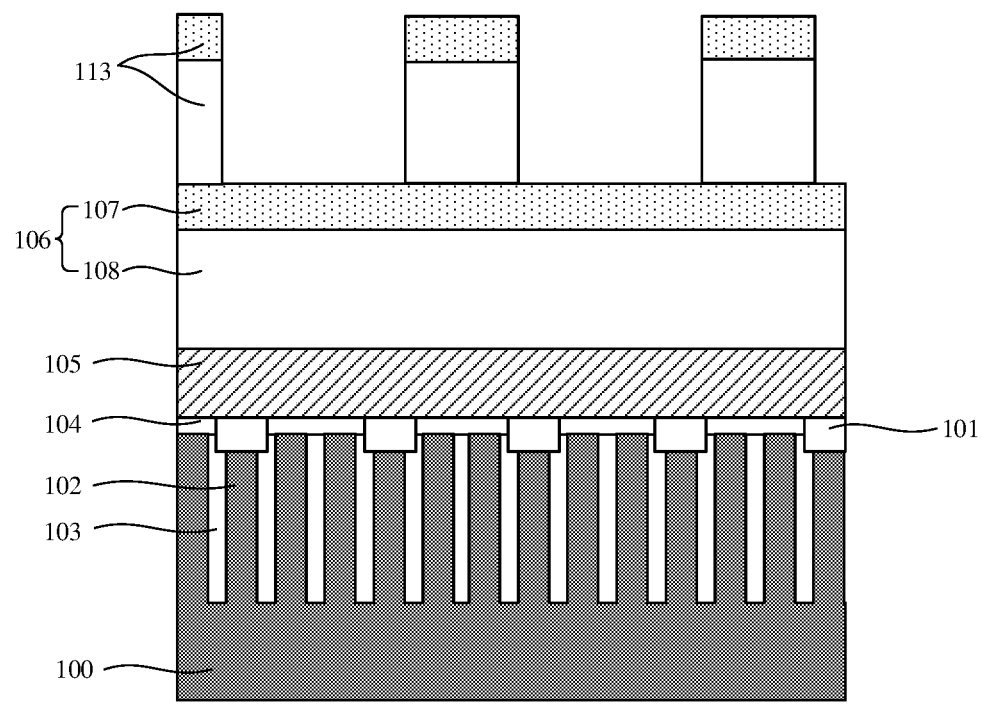

Referring to FIG. 2, the core layer 109 (referring to FIG. 1) is etched by taking the patterned photoresist layer 112 (referring to FIG. 1) as a mask to form a plurality of discrete core parts 113. The core part 113 is of a double-layer structure. In other embodiments, the core part may also be of a single-layer structure.

After the core part 113 is formed, the patterned photoresist layer 112 is removed.

Figure 3:
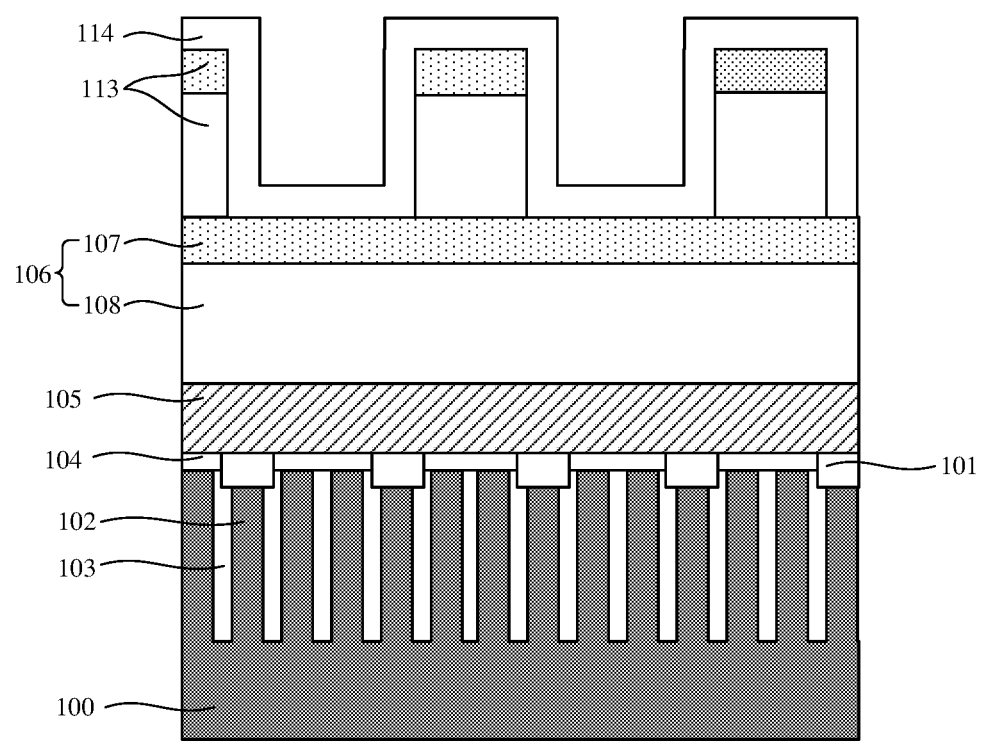

Referring to FIG. 3, a side wall film 114 covering a top and a side wall of the core part 113 and the bottom-layer mask layer 106 is formed.

In the present embodiment, the side wall film 114 is deposited by an atomic layer deposition process which makes the thickness of the side wall film 114 more uniform. In other embodiments, the side wall film may be formed by chemical vapor deposition, physical vapor deposition, and other methods.

A material of the side wall film 114 is different from that of the core part 113, and may be silicon oxide, for example.

Figure 4:
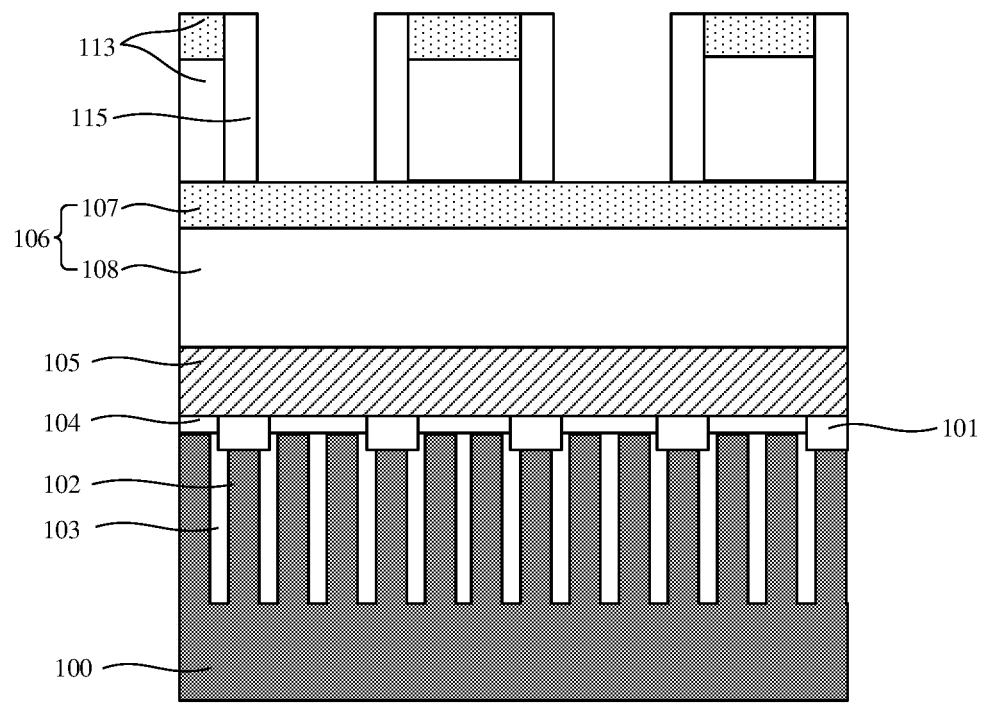

Referring to FIG. 4, the side wall film 114 (referring to FIG. 3) is etched to form side wall layers located on opposite side walls of the core parts 113. Due to an etching load effect, that is, the larger the etching area, the easier it is to be etched. The side wall film 114 (referring to FIG. 3) deposited on the side walls of the core parts 113 is not easily etched away, thereby forming the side wall layers.

Figure 5:
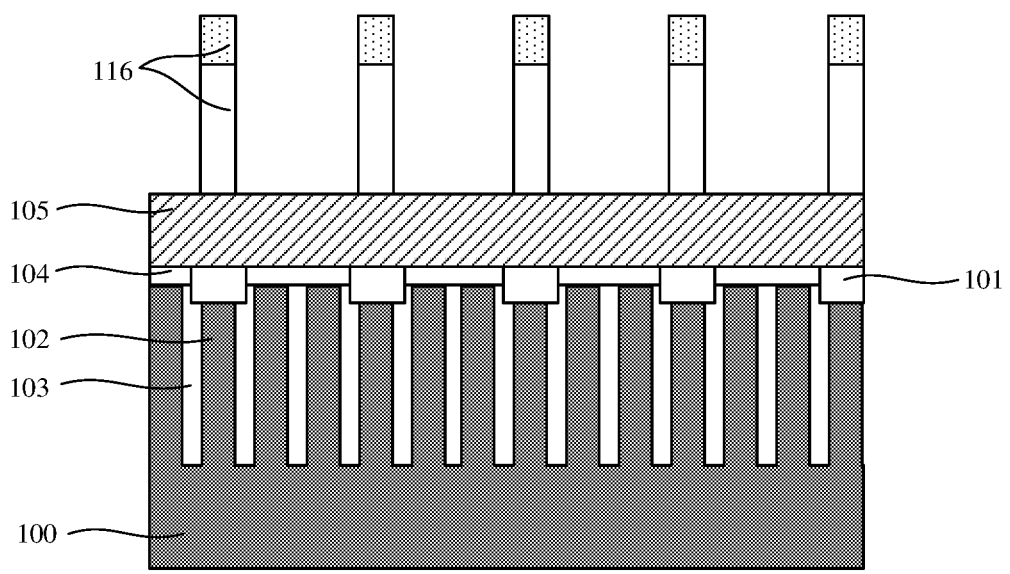

Referring to FIG. 5, the core parts 113 (referring to FIG. 4) are removed, and the side wall layers are used as the patterned mask layer 115.

The bottom-layer mask layer 106 (referring to FIG. 4) is etched by taking the patterned mask layers 115 as a mask to form a patterned bottom-layer mask layers 116. In the present embodiment, the patterned bottom-layer mask layers 116 are of a double-layer structure. In other embodiments, the patterned bottom-layer mask layer may also be of a single-layer structure.

Figure 6:
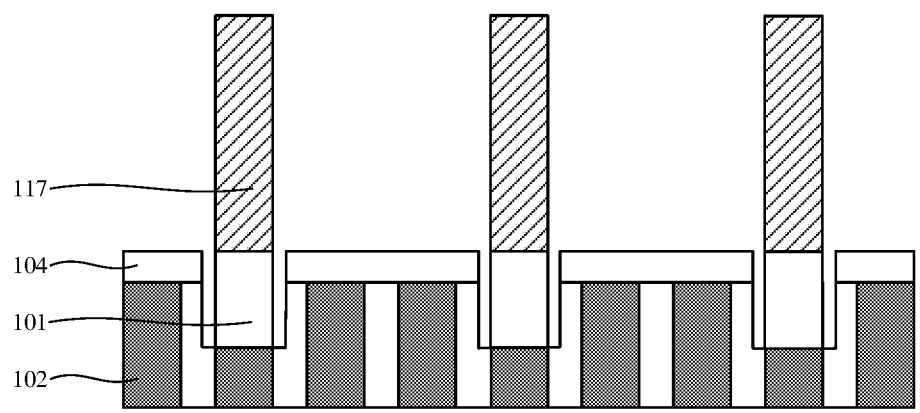

Referring to FIG. 6, the pseudo bit line layer 105 (referring to FIG. 5) is etched by taking the patterned bottom-layer mask layers 116 (referring to FIG. 5) as a mask to form the pseudo bit line structures 117. After the pseudo bit line structures 117 are formed, the patterned bottom-layer mask layers 116 are removed.

In the present embodiment, the patterned mask layers 115 (referring to FIG. 4) transmit the pattern to the pseudo bit line structures 117 by the patterned bottom-layer mask layers 116. Therefore, the width of a pseudo bit line structure 117 is consistent with that of a patterned mask layer 115. The less the width of the patterned mask layer 115, the less the width of the pseudo bit line structure 117 and further the less the size of the memory.

The material of the pseudo bit line structures 117 includes silicon nitride, silicon oxynitride, or silicon carbonitride. The material of the pseudo bit line structures 117 is different from that of the pseudo bit line contact layers 101.

It is worth noting that in other embodiments, the pseudo bit line structures can be formed without a double patterning process. For example, the pseudo bit line structures may be formed as follows. A single-layer hard mask layer is directly formed on the pseudo bit line layer, and the hard mask layer is lithographed to form a plurality of discrete core parts on the pseudo bit line layer. A side wall film covering tops and side walls of the core parts and the pseudo bit line layer is formed. The side wall film is etched to form the side wall layers located on opposite side walls of the core parts. The core parts are removed. The side wall layers are as the patterned mask layers. The pseudo bit line layer is etched using the patterned mask layers to form the pseudo bit line structures.

Figure 7:
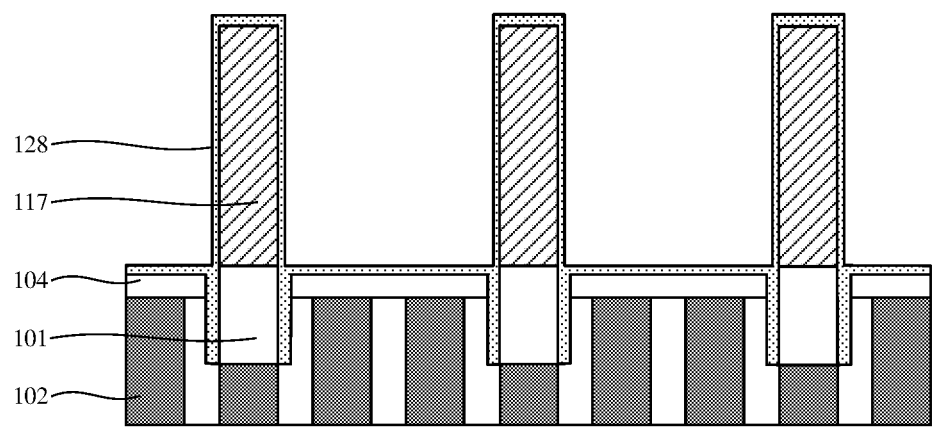
Figure 8:
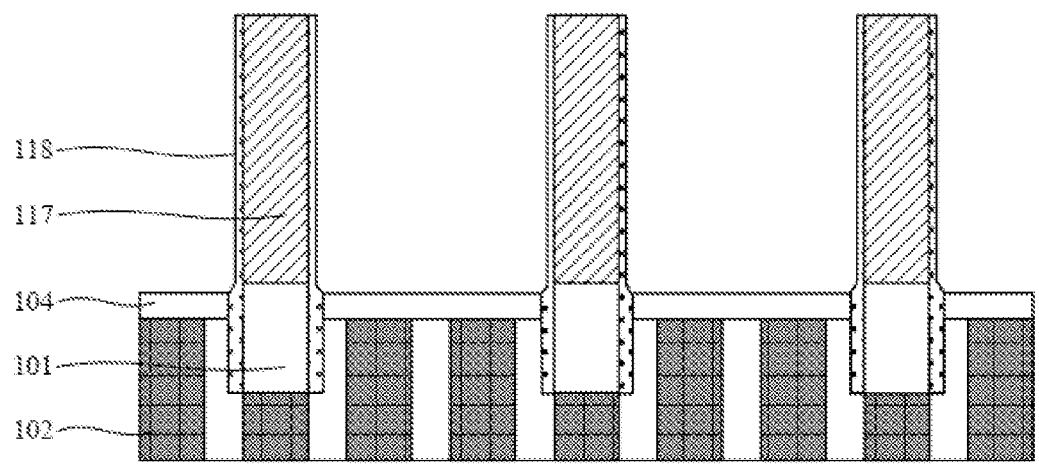

Referring to FIG. 7 to FIG. 8, a dielectric layer 118 is formed on side walls of the pseudo bit line structures 117 and the pseudo bit line contact layers 101.

In the process of subsequently etching to remove the sacrificial layers, the dielectric layer 118 can protect a bit line conductive part and ensure the accuracy of the shape and size of the bit line conductive part.

A material of the dielectric layer 118 includes a low-dielectric constant material which can reduce the parasitic capacitance of the memory and improve the operating speed of the memory.

Specifically, in the present embodiment, said forming the dielectric layer 118 includes the following operations. Referring to FIG. 7, an initial dielectric film 128 is further formed on the surfaces of the second isolation layers 104 and on the surfaces of the pseudo bit line structures 117. Referring to FIG. 8, the initial dielectric film 128 (referring to FIG. 7) on the surfaces of the second isolation layers 104 and top surface of the pseudo bit line structures 117 are removed.

Figure 9:
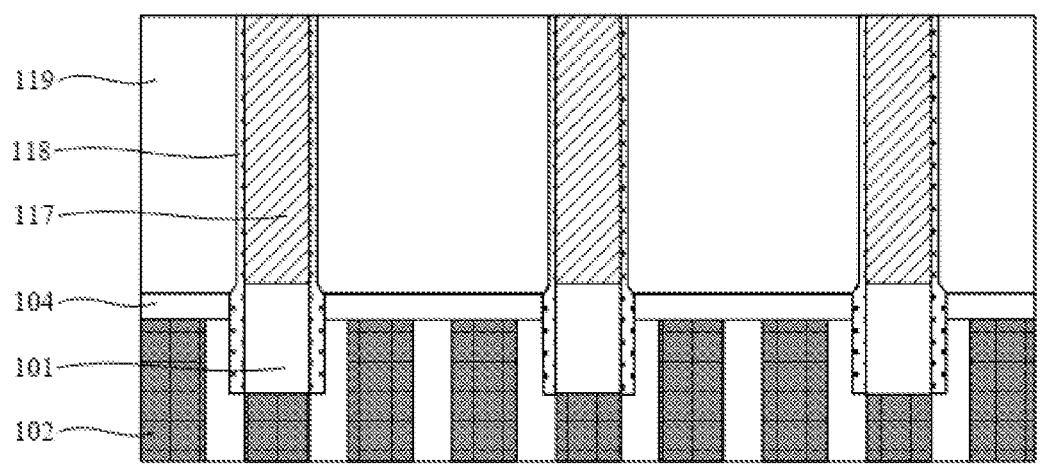

Referring to FIG. 9, sacrificial layers 119 filling regions between the adjacent pseudo bit line structures 117 are formed, and the sacrificial layers 119 are located on the side walls of the pseudo bit line structures 117.

The sacrificial layers 119 also cover the surfaces of the second isolation layers 104 and the side wall surfaces of the dielectric layers 118.

In other embodiments, the sacrificial layers may also be located on the side walls of the pseudo bit line contact layers.

The material of the sacrificial layers 119 is different from the material of the dielectric layers 118, and may be silicon oxide, for example.

Figure 10:
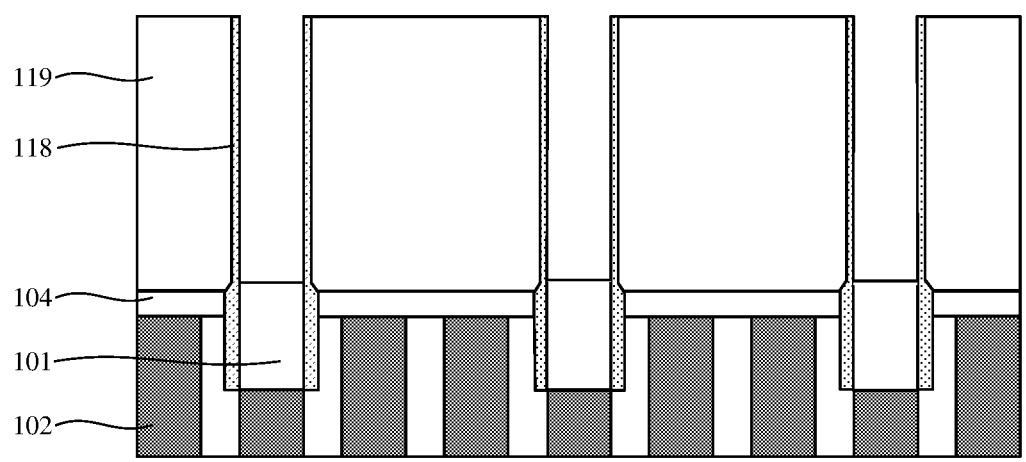

Referring to FIG. 10, the pseudo bit line structures 117 (referring to FIG. 9) are removed to form through holes exposing the pseudo bit line contact layers 101. In the present embodiment, an etching rate of the pseudo bit line structures 117 is greater than that of the sacrificial layers 119, and an etching selection ratio of the material of the pseudo bit line structures 117 to the material of the sacrificial layers 119 is 5-15, e.g. 8, 10, or 13. The pseudo bit line structures 117 are removed using a wet etching method, and an etching solvent is a hot phosphoric acid solution. In other embodiments, the pseudo bit line structures may also be removed using a dry etching method.

Figure 11:
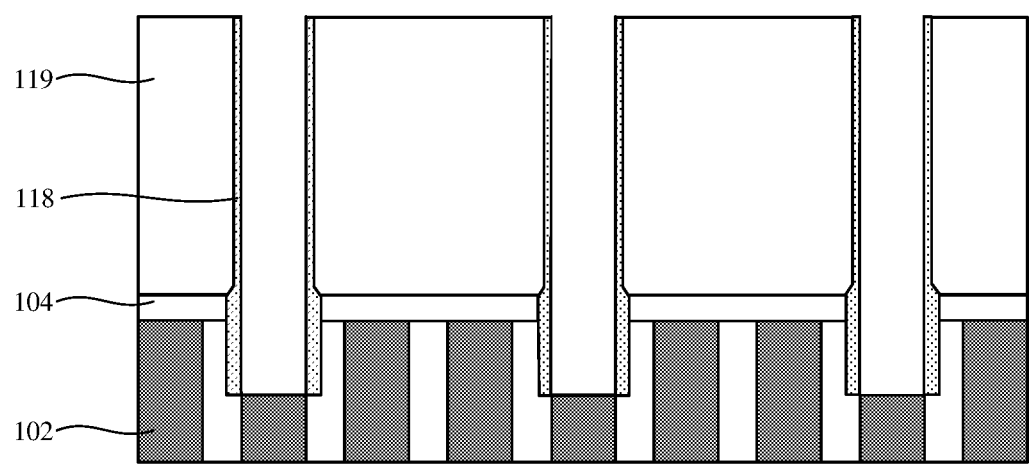

Referring to FIG. 11, the pseudo bit line contact layers 101 (referring to FIG. 10) are removed to form through holes located in the substrate 100 (referring to FIG. 5).

In the present embodiment, the pseudo bit line contact layers 101 are removed by wet etching. In other embodiments, the pseudo bit line contact layers may also be removed by dry etching.

Figure 12:
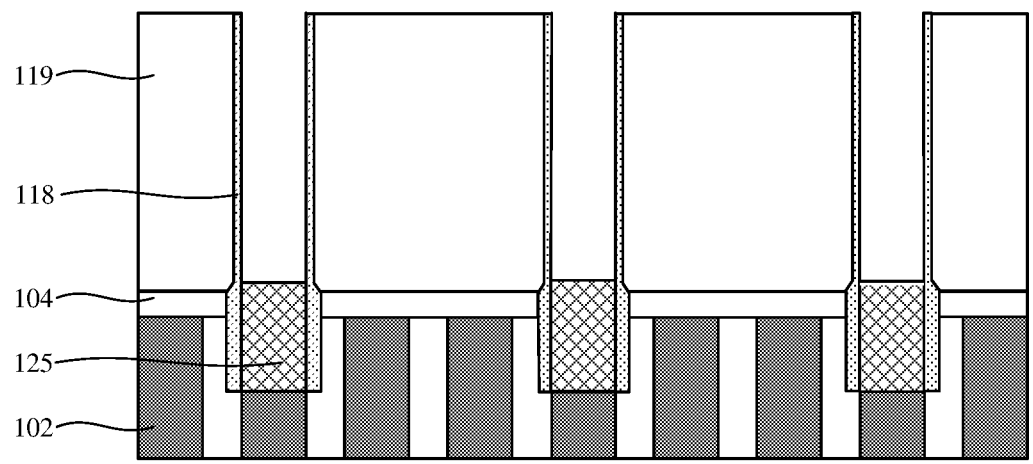

Referring to FIG. 12, bit line contact layers 125 filling the through holes in the substrate 100 (referring to FIG. 5) are formed, and the bit line contact layers 125 are electrically connected to the active areas 102.

In the present embodiment, the bit line contact layers 125 are formed using an epitaxial growth technology, and the material of bit line contact layers 125 includes monocrystalline silicon. Meanwhile, the monocrystalline silicon may be doped with various ions to improve the conductivity.

Therefore, forming the bit line contact layers 125 by the epitaxial growth technology can avoid damage or residual impurities, which may be caused if the pseudo bit line structures 117 (referring to FIG. 9) are removed by etching. Meanwhile, the resistance of monocrystalline silicon or ion-doped monocrystalline silicon is lower than that of polycrystalline silicon. Thus, the conductivity of the bit line contact layer 125 can be improved and the resistance of a contact surface between a bit line contact layer 125 and an active area 102 can be reduced, thereby increasing the operating speed of the memory.

Figure 13:
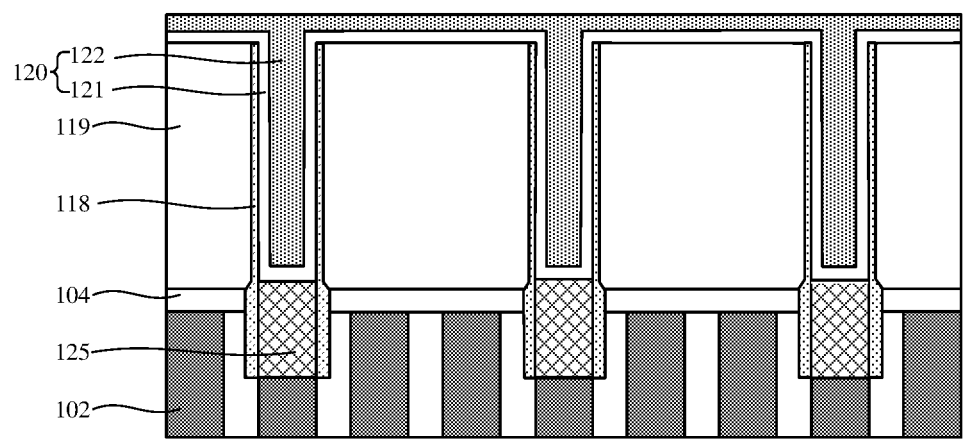
Figure 14:
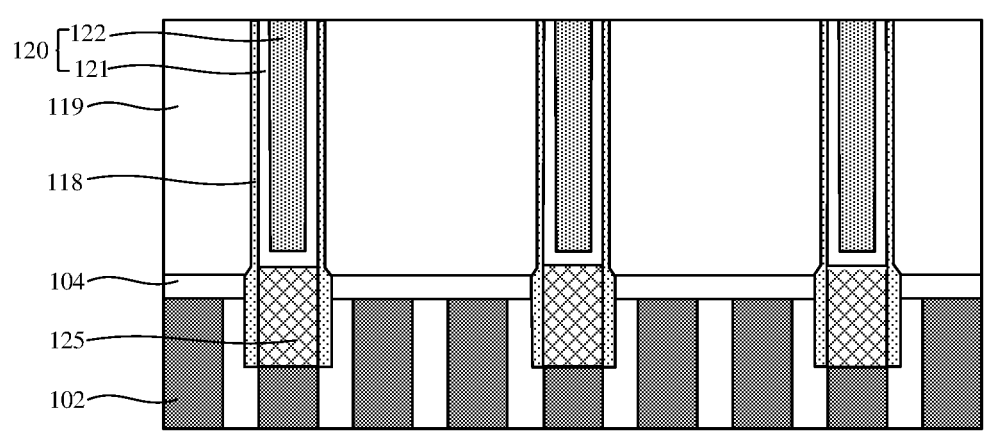

Referring to FIGS. 13 and 14, a bit line conductive part 120 filling the through holes and covering the bit line contact layers 125 is formed.

The bit line conductive part 120 is a conductive structure in a bit line structure. The bit line conductive parts are formed by filling the through holes, and the bit line conductive parts 120 are supported by the sacrificial layers 119 during the formation process. Therefore, even if the width of the bit line conductive part 120 is small, the phenomenon of tilting or collapsing is unlikely to occur. In addition, since an etching process is not used, no impurities generated by etching remain in the bit line conductive part 120, so that the resistance of the bit line conductive part 120 is reduced, and the operating speed of the memory is increased.

Said forming the bit line conductive part 120 includes the following operations. A barrier layer 121 is formed on a bottom and a side wall of the through hole. A conductive layer 122 filling up the through hole is formed on a surface of the barrier layer 121.

In the present embodiment, thicknesses of the conductive layer 122 and the barrier layer 121 formed by the atomic deposition layer deposition technology are more uniform. In other embodiments, other deposition technologies can also be used.

A material of the barrier layer 121 includes one or both of tantalum nitride and titanium nitride. Tantalum nitride or titanium nitride can conduct electricity, and has a good ability of blocking the diffusion of the conductive layer 122. A material of the conductive layer 122 includes one or more of ruthenium, tungsten, gold, or silver. Ruthenium, tungsten, gold or silver are low-resistance metals, which can further reduce the resistance of the conductive layer 122 and increase the operating speed of the memory.

In other embodiments, the bit line conductive part may also be of a single-layer structure.

In the present embodiment, as shown in FIG. 13, the formed conductive layer 122 and the barrier layer 121 are also located on the top surface of the sacrificial layers 119. As shown in FIG. 14, the bit line conductive part 120 is planarized to remove the conductive layer 122 and the barrier layer 121 (referring to FIG. 11) which are higher than the top surface of the sacrificial layer s119.

In the present embodiment, a chemical mechanical polishing technology is used to planarize the bit line conductive part 120.

Figure 15:
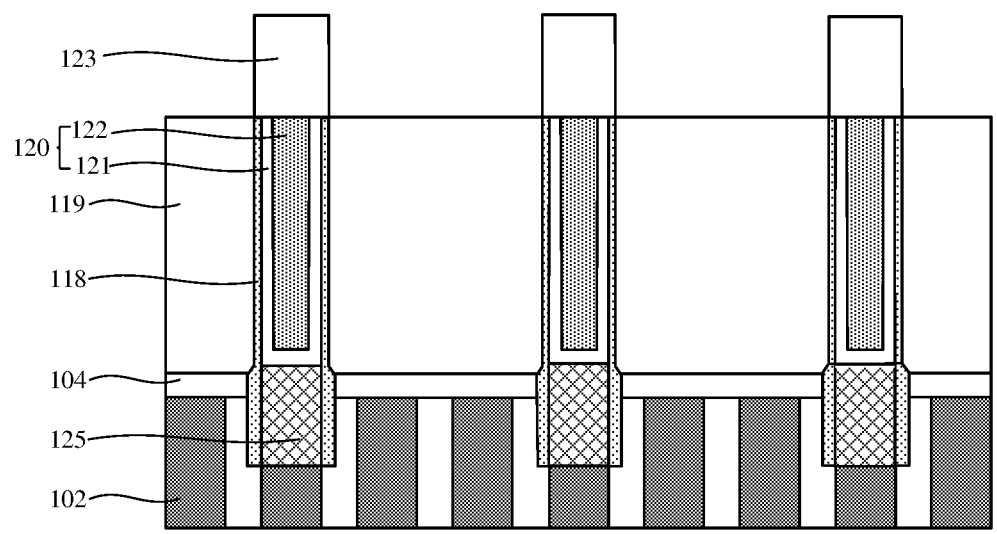

Referring to FIG. 15, an insulation cover layer 123 is formed on the top of each bit line conductive part 120.

The insulation cover layer 123 serves as an insulation structure in a bit line structure.

In the present embodiment, the insulation cover layer 123 is formed by an SADP which makes the size of the insulation cover layer 123 more accurate.

Figure 16:
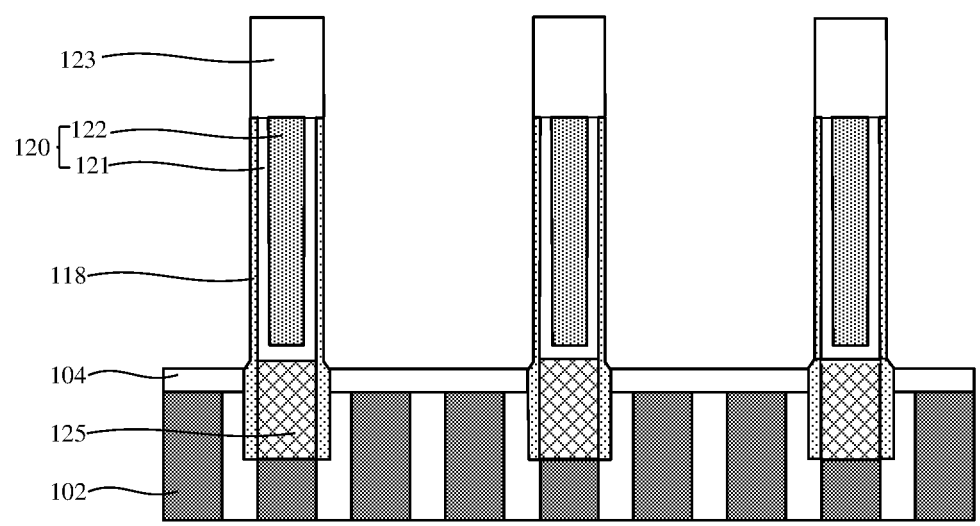

Referring to FIG. 16, after the insulation cover layers 123 are formed, the sacrificial layers 119 are removed (referring to FIG. 15).

The etching rate of the sacrificial layers 119 is greater than the etching rate of the insulation cover layers 123, and the etching selectivity ratio of the material of the sacrificial layers 119 to the material of the insulation cover layers 123 is 5-15, such as 8, 10 or 13. A high etching selectivity ratio can ensure that in the process of removing the sacrificial layers 119, the insulation cover layers 123 maintain the original shape and size. In the present embodiment, the wet etching method is used to remove the sacrificial layers 119, and a hydrofluoric acid solution is used as an etchant. In other embodiments, the dry etching method can also be used to remove the sacrificial layers.

Figure 17:
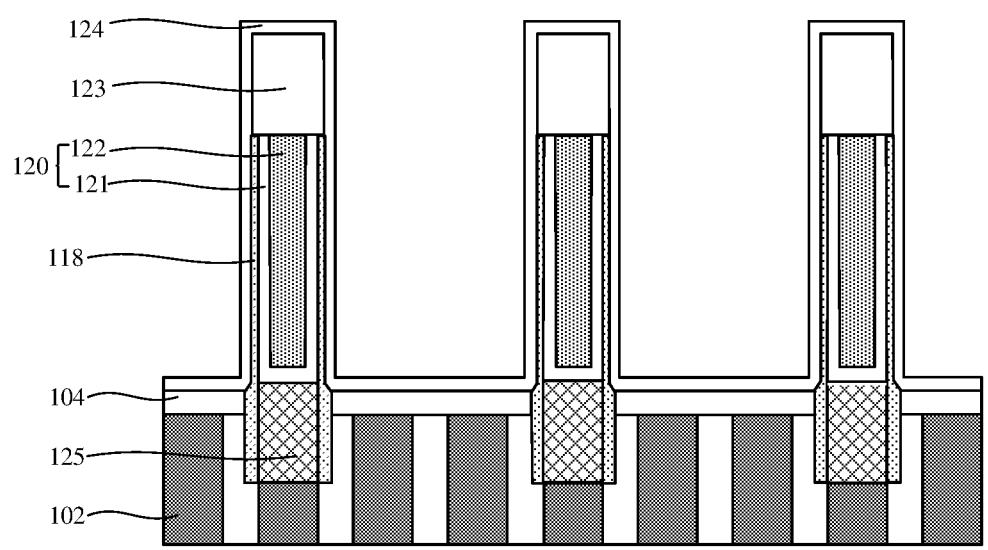

Referring to FIG. 17, a protective layer 124 is formed on a surface of the bit line conductive part 120 and a surface of the insulation cover layer 123.

In the present embodiment, the protective layer 124 also covers the surface of the second isolation layer 104 and the surface of the dielectric layer 118.

In the present embodiment, the protective layer 124 is formed by using the atomic layer deposition technology.

A material of the protective layer 124 includes silicon carbonitride.

In summary, the bit line contact layers 125 are formed by an epitaxial growth technology in the present embodiment, so that damage and residual impurities caused in the process of removing the pseudo bit line structures 117 by etching can be avoided. Meanwhile, the resistance of the bit line contact layers 125 of monocrystalline silicon is lower than that of the bit line contact layers of a polycrystalline silicon material, so that the resistance of an interface between a bit line contact layer 125 and an active area 102 can be reduced. Thus, the performance of the memory is better.

Figure 18:
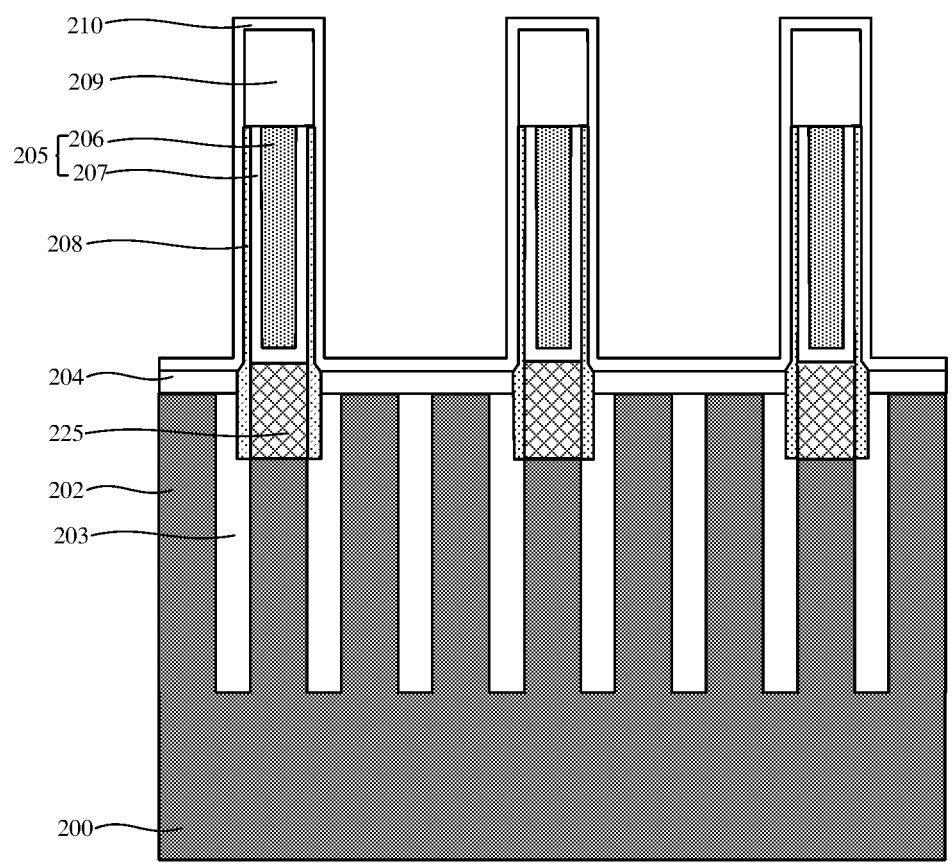
FIG. 18 is a schematic structure diagram of a memory provided by a second embodiment of the present disclosure.

A second embodiment of the present disclosure also provides a memory. The memory may be manufactured by method for manufacturing a memory in the first embodiment. FIG. 18 is a schematic structure diagram of a memory provided by the present embodiment.

Referring to FIG. 18, the memory includes: a substrate 200, a plurality of discrete bit line contact layers 225, and bit line conductive parts 205. A plurality of active areas 202 are provided in the substrate 200, and the bit line contact layers 225 are one-to-one electrically connected to the active areas 202. The bit line conductive parts 205 are located on tops of the bit line contact layers 225.

The memory provided in the present embodiment will be described in detail below with reference to the accompanying drawings.

First isolation layers 203 are further included between the active areas 202.

The first isolation layers 203 are used to isolate the active areas 202.

Second isolation layers 204 are also provided on a surface of the substrate 200. The second isolation layers 204 are used to isolate the bit line contact layers 201.

A material of the bit line contact layers 225 includes monocrystalline silicon or ion-doped monocrystalline silicon. The resistance of monocrystalline silicon is less, thus the resistance of a contact surface between a bit line contact layer 225 and an active area 102 can be reduced.

A bit line conductive part 205 further includes a conductive layer 206 located at a top of a bit line contact layer 225; and a barrier layer 207 located between the bit line contact layer 225 and the conductive layer 206. The barrier layer 207 also covers a side wall of the conductive layer 206.

The material of the conductive layer 206 includes one or more of ruthenium, tungsten, gold or silver. Any of Ruthenium, tungsten, gold or silver is a low-resistance metal, which can reduce the resistance of the conductive layer 206 and increase the operating speed of the memory.

The material of the barrier layer 207 is a conductive material, such as tantalum nitride or titanium nitride.

The thickness of the barrier layer 207 is 2.5 to 6 nm, for example, 3 nm. The barrier layer 207 with this thickness has a good ability to block the diffusion of the conductive layer 206.

A dielectric layer 208 is located on a side wall of the bit line conductive part 205 and a side wall of the bit line contact layer 201. An insulation cover layer 209 is located on a top of the bit line conductive part 205. A protective layer 210 is located on a surface of the insulation cover layer 209 and a surface of the dielectric layer 208. The protective layer 210 is also located on surfaces of the second isolation layers 204.

In summary, the material of the bit line contact layers 225 of the memory provided by the present embodiment includes monocrystalline silicon, or monocrystalline silicon containing doping ions. The resistance of the monocrystalline silicon is lower, so that the resistance of a contact surface between a bit line contact layer 225 and an active area 102 can be reduced. The material of the conductive layer 206 is a low-resistance material such as ruthenium, tungsten, gold, or silver so that the resistance of the conductive layer 206 is low, and the operating speed of the memory is high. In addition, the barrier layer of the memory provided by the present embodiment is well capable of blocking the diffusion of the conductive layer, and the performance of the memory can be further improved.

It will be appreciated by those of ordinary skill in the art that the various implementations described above are specific embodiments for implementing the present disclosure and that various changes in form and details may be made in practical application without departing from the spirit and scope of the present disclosure. Any person skilled in the art can make various changes and modifications without departing from the spirit and scope of the present disclosure, and therefore the scope of protection of the present disclosure should be determined by the scope of the claims.

INDUSTRIAL APPLICABILITY

In an embodiment of the present disclosure, method for manufacturing a memory includes: providing a substrate in which a plurality of active areas are provided and a plurality of discrete pseudo bit line contact layers respectively connected to the active areas; forming pseudo bit line structures on tops of the pseudo bit line contact layers; forming sacrificial layers that fill regions between the adjacent pseudo bit line structures and are located on side walls of the pseudo bit line structures and the pseudo bit line contact layers; after forming the sacrificial layers, removing the pseudo bit line structures to form through holes exposing the pseudo bit line contact layers; removing the pseudo bit line contact layers to form through holes in the substrate; and forming bit line contact layers that fill the through holes in the substrate and are electrically connected to the active areas. Thus, the bit line contact layers are formed by means of filling the through holes, so that the damage of the bit line contact layers or residual impurities, which may be caused if the pseudo bit line structure is removed, can be avoid, thereby increasing the operating speed of the memory.

The invention claimed is:

1. A method for manufacturing a memory, comprising:
providing a substrate and a plurality of discrete pseudo bit line contact layers, a plurality of active areas being provided in the substrate, and the pseudo bit line contact layers being one-to-one electrically connected to the active areas;
forming pseudo bit line structures on tops of the pseudo bit line contact layers;
forming sacrificial layers that fill regions between adjacent pseudo bit line structures of the pseudo bit line structures and are located on side walls of the pseudo bit line structures and side walls of the pseudo bit line contact layers;

removing the pseudo bit line structures to form first through holes exposing the pseudo bit line contact layers after forming the sacrificial layers; and removing the pseudo bit line contact layers to form second through holes in the substrate, and forming bit line contact layers that fill the second through holes in the substrate and are electrically connected to the active areas.

2. The method for manufacturing a memory of claim 1, wherein a material of the pseudo bit line contact layers is different from that of the pseudo bit line structures.

3. The method for manufacturing a memory of claim 2, wherein the material of the pseudo bit line contact layers includes silicon nitride, silicon oxynitride or silicon carbonitride.

4. The method for manufacturing a memory of claim 2, wherein the material of the pseudo bit line structures includes silicon nitride, silicon oxynitride, or silicon carbonitride.

5. The method for manufacturing a memory of claim 1, wherein a material of the bit line contact layers includes monocrystalline silicon.

6. The method for manufacturing a memory of claim 1, wherein a method of forming the bit line contact layers comprises an epitaxial growth process.

7. The method for manufacturing a memory of claim 1, wherein forming the pseudo bit line structures comprises: forming a pseudo bit line layer on the substrate, the pseudo bit line layer covering the pseudo bit line contact layers; forming patterned mask layers on the pseudo bit line layer; and etching the pseudo bit line layer by taking the patterned mask layers as a mask to form the pseudo bit line structures.

8. The method for manufacturing a memory of claim 7, wherein forming the patterned mask layers comprises: forming a plurality of discrete core parts on the pseudo bit line layer; forming a side wall film covering tops and side walls of the core parts and the pseudo bit line layer; etching the side wall film to form side wall layers on opposite side walls of the core parts; and removing the core parts, the side wall layers serving as the patterned mask layers.

9. The method for manufacturing a memory of claim 1, wherein an etching selection ratio of a material of the pseudo bit line structures to a material of the sacrificial layers is 5-15 in a process of removing the pseudo bit line structures.

10. The method for manufacturing a memory of claim 9, wherein the material of the sacrificial layers comprises silicon oxide.

11. The method for manufacturing a memory of claim 1, before forming the sacrificial layers, further comprising: forming dielectric layers on the side walls of the pseudo bit line structures and the side walls of the pseudo bit line contact layers, wherein a material of the dielectric layers is different from a material of the sacrificial layers, and the sacrificial layers are located on side wall surfaces of the dielectric layers instead of on surfaces of the side walls of the pseudo bit line structures and the side walls of the pseudo bit line contact layers.

12. The method for manufacturing a memory of claim 11, wherein the material of the dielectric layers comprises a low-dielectric-constant material.

13. The method for manufacturing a memory of claim 1, wherein bit line conductive parts are formed on the bit line contact layers, and forming the bit line conductive parts comprises: forming barrier layers on bottoms and side walls of the first through holes on the bit line contact layers; and forming conductive layers on upper surfaces of the barrier layers.

14. The method for manufacturing a memory of claim 13, further comprising: after forming the bit line conductive parts, forming insulation cover layers at tops of the bit line conductive parts; after forming the insulation cover layers, removing the sacrificial layers; and after removing the sacrificial layers, forming protective layers on surfaces of the bit line conductive parts and the insulation cover layers.

* * * * *